United States Patent [19]

Ohhashi

[11] Patent Number: 5,440,163
[45] Date of Patent: Aug. 8, 1995

[54] CMOS ESD PROTECTION STRUCTURE

[75] Inventor: Masayuki Ohhashi, Tokyo, Japan

[73] Assignee: NEC Corporation, Tokyo, Japan

[21] Appl. No.: 369,317

[22] Filed: Jan. 5, 1995

Related U.S. Application Data

[63] Continuation of Ser. No. 113,059, Aug. 30, 1993, abandoned.

[30] Foreign Application Priority Data

Sep. 1, 1992 [JP] Japan .................................. 4-233225

[51] Int. Cl.⁶ ........................................... H01L 27/02
[52] U.S. Cl. .................................. 257/355; 257/357; 257/536
[58] Field of Search ............... 257/357, 359, 758, 768, 257/528, 536, 538, 355, 363, 208, 211

[56] References Cited

U.S. PATENT DOCUMENTS

| | | | |
|---|---|---|---|
| 4,931,845 | 6/1990 | Ema | 257/768 |
| 5,060,037 | 10/1991 | Rountree | 257/357 |
| 5,241,206 | 8/1993 | Lee et al. | 257/536 |

OTHER PUBLICATIONS

Kueing-Long Chen, "Effects of Interconnect Process and Snapback Voltage on the ESD Failure Threshold of NMOS Transistors", Dec. 1988 EOS/ESD Symposium Proceedings, Texas Instruments Incorporated, Dallas, Tex., pp. 212-219.

Primary Examiner—Sara W. Crane
Assistant Examiner—Nathan Kip Kelley
Attorney, Agent, or Firm—Young & Thompson

[57] ABSTRACT

A semiconductor integrated circuit device including a CMOS inverter which can be prevented to be destroyed due to electrostatic charges. First and second contact layers are formed just above the source and drain regions of an n-channel MOS transistor, respectively, between a first interlayer insulator film having first contact holes and a second interlayer insulator film having second contact holes. The first and second contact layers are made of material higher in electric resistance than metal, for example metal silicides. The source and drain regions of the n-channel MOS transistor are respectively contacted through the first contact holes with the first and second contact layers which are respectively contacted through the second contact holes with a metal ground wiring layer and a metal output wiring layer. The first and second interlayer insulator films have third contact holes penetrating both interlayer insulator films. The source and drain regions of a p-channel MOS transistor are electrically connected through third contact holes to a metal power source wiring layer and the metal output wiring layer, respectively.

16 Claims, 3 Drawing Sheets

CMOS ESD PROTECTION STRUCTURE

This application is a continuation of application Ser. No. 08/113,059, filed Aug. 30, 1993, now abandoned.

BACKGROUND OF THE INVENTION

1. Field of the Invention

The present invention relates to a semiconductor integrated circuit device and more particularly, to a semiconductor integrated circuit device including a MOS (Metal-Oxide-Semiconductor) transistor whose source and drain regions have equivalent resistances, respectively.

2. Description of the Related Art

A semiconductor integrated circuit device usually includes a Complementary MOS (CMOS) inverter, which is composed of a p-channel MOS transistor and an n-channel MOS transistor connected in series. The source region of the p-channel MOS transistor is electrically connected to a wiring layer (power supply wiring layer) to be connected to a power supply, the drain region thereof is electrically connected to a wiring layer (output wiring layer) from which an output signal is taken out and the drain region of the n-channel MOS transistor, and the source region of the n-channel MOS transistor is electrically connected to a wiring layer (ground wiring layer) to be grounded.

Conventionally, metal layers having low electrical resistivities, such as aluminum and its alloys, are widely used as the wiring layers, and these metal layers are directly contact with the source regions and the drain regions, respectively, for interconnection.

With conventional semiconductor integrated circuit devices, when the CMOS inverter is directly connected to an input terminal or pin and/or an output terminal or pin of the integrated circuit device, the source and drain regions of the transistor are electrically connected to the metal wiring layers through wiring layers made of a material other than metal in order to prevent its breakdown due to electrostatic pulses. The entire contacting area of the source and drain regions are respectively contacted with the wiring layers made of material other than metal. Thus, alloy spiking due to electrostatic pulses can be prevented.

In addition, in order to increase the electrostatic discharge withstanding voltage circuit configurations and/or layouts of input and output protection circuits are devised, and the input and/or output terminals or pins used are suitably selected.

However, with conventional semiconductor integrated circuit devices, even if the above-described protection means is provided, there is a problem in that when electrostatic pulses are applied between the power supply terminal and the ground terminal of the device, some of the source and drain regions and the gate insulators of the n- and/or p-channel MOS transistor constituting the CMOS inverter are destroyed in an internal circuit of the device. Here, the word "internal circuit" means a circuit where all transistors in its internal circuit are not directly connected to the external terminals or pins of the integrated circuit device.

The above-described problem is particularly important for a comparatively large MOS transistor having a channel width of 100 μm or more. It is believed that the problem results from the fact that an internal electric resistance of such a transistor is comparatively low so that most of the electric current due to the electrostatic pulses flows through the transistor.

There are some measures available to solve the problem, one of which is to respectively provide protection resistors, such as diffusion resistors, to the power supply wiring layer and the ground wiring layer. However, there arises the problem that high-speed operation of the transistor is degraded because large electric resistances are respectively inserted in the power supply and ground wiring layers in series.

Another available measure is that internal resistances existing in the source and drain regions of the MOS transistor are utilized as protection resistors. This measure is often employed in an output transistor, in which distances between the contact areas of the source and drain regions from the metal wiring layers and the gate electrode are set longer than the standard values. However, there arises the problem of an increase in pellet-size because the chip-occupied area of the transistor becomes large.

SUMMARY OF THE INVENTION

Accordingly, an object of the present invention is to provide a semiconductor integrated circuit device in which a MOS transistor can be prevented from being destroyed due to electrostatic charges without degrading its operation and increasing its chip-occupied area.

According to a first aspect of the present invention, a semiconductor integrated circuit device is provided, which includes a MOS transistor formed on a semiconductor substrate.

A first wiring layer is electrically connected to the gate electrode of the MOS transistor, and a first interlayer insulator film having first contact holes is formed on the substrate so as to cover the source and drain regions and the gate electrode.

First and second contact layers are formed next above the source and drain regions, respectively, on the first interlayer insulator film. A second interlayer insulator film having second contact holes is formed on the first interlayer insulator film so as to cover the first and second contact layers. Second and third wiring layers are formed on the second interlayer insulator film and are electrically connected to the source and drain regions, respectively.

The first and second contact layers are made of a material which has a higher electrical resistance than the second and third wiring layers.

The source and drain regions are in contact through the first contact holes with the first and second contact layers, respectively, and the first and second contact layers are in contact through the second contact holes with the second and third wiring layers, respectively.

With the semiconductor integrated circuit device according to the first aspect of the present invention, the drain and source regions of the MOS transistor are electrically connected through the first and second contact layers to the second and third wiring layers which have a higher electrical resistance than these wiring layers, respectively, so that the transistor can be prevented from being destroyed due to electrostatic charges applied between the power supply terminal and the ground terminal of the device.

Besides, since equivalent resistances with very small values of electric resistance, for example 30 Ω or less, are respectively connected to the source and drain regions, the first and second contact layers hardly affect the operation of the transistor. There arises no problem about the pellet-size because the chip-occupied area of the transistor does not increase.

According to a second aspect of the present invention, a semiconductor integrated circuit device is provided with n- and p-channel MOS transistors constituting a CMOS inverter on a semiconductor substrate.

A first wiring layer is electrically connected to the gate electrodes of both MOS transistors. A second wiring layer is electrically connected to the source region of the p-channel MOS transistor, a third wiring layer is electrically connected to the source region of the n-channel MOS transistor, and a fourth wiring layer is electrically connected to the drain regions of both MOS transistors.

First and second contact layers are formed next above the source and drain regions of the n-channel MOS transistor, respectively, between a first interlayer insulator film having first contact holes and a second interlayer insulator film having second contact holes.

The source and drain regions of the n-channel MOS transistor are in contact through the first contact holes with the first and second contact layers, respectively. The first and second contact layers are in contact through the second contact holes with the third and fourth wiring layers, respectively.

The first and second interlayer insulator films further have third contact holes penetrating both of interlayer insulator films. The source and drain regions of the p-channel MOS transistor are in contact through the third contact holes to the second and fourth wiring layers, respectively.

With the semiconductor integrated circuit device according to the second aspect of the present invention, the drain and source regions of the n-channel MOS transistor are electrically connected through the first and second contact layers to the third and fourth wiring layers which have a higher electrical resistance than these wiring layers, respectively, so that the inverter can be prevented from being destroyed due to electrostatic charges applied between the power supply terminal and the ground terminal of the device.

Besides, since equivalent resistances with very small values of electric resistance are respectively connected to the source and drain regions of the n-channel MOS transistor, the first and second contact layers hardly affect the operation of the CMOS inverter. Further, there arises no problem regarding pellet-size.

In the first and second aspects of the present invention, the MOS transistor may have a single source region and a single drain region, or may have a plurality of source regions and a plurality of drain regions and its channel may be divided.

Any arrangement may be applied for the first and second contact holes. However, preferably, the first and second contact holes are alternately arranged in longitudinal directions of the source and drain regions, respectively. In this case, the first and second contact holes arranged in the source region and the first and second contact holes arranged in the drain region are preferably staggered. The withstanding voltage for electrostatic discharge of the integrated circuit device can thus be improved.

Preferably, the MOS transistor or transistors belong to an internal circuit of the integrated circuit device and an effective channel width of the MOS transistor is 100 $\mu m$ or more.

Aluminum or its alloy films are generally used as the second to fourth wiring layers, so that any film which has a higher electrical resistance than these metal wiring layers may be used as the first and second contact layers. For example, refractory metal silicides such as tungsten silicide $WSi_x$ (x ranges from 2.5 to 2.7 preferably), polysilicon or the like may be used. The size, thickness, shape and number of the first and second contact layers may be set arbitrarily according to desired values of electric resistance.

DETAILED DESCRIPTION OF THE PREFERRED EMBODIMENT

One preferred embodiment of the present invention will be described below referring to FIGS. 1, 2A, 2B and 3.

Figure 1:
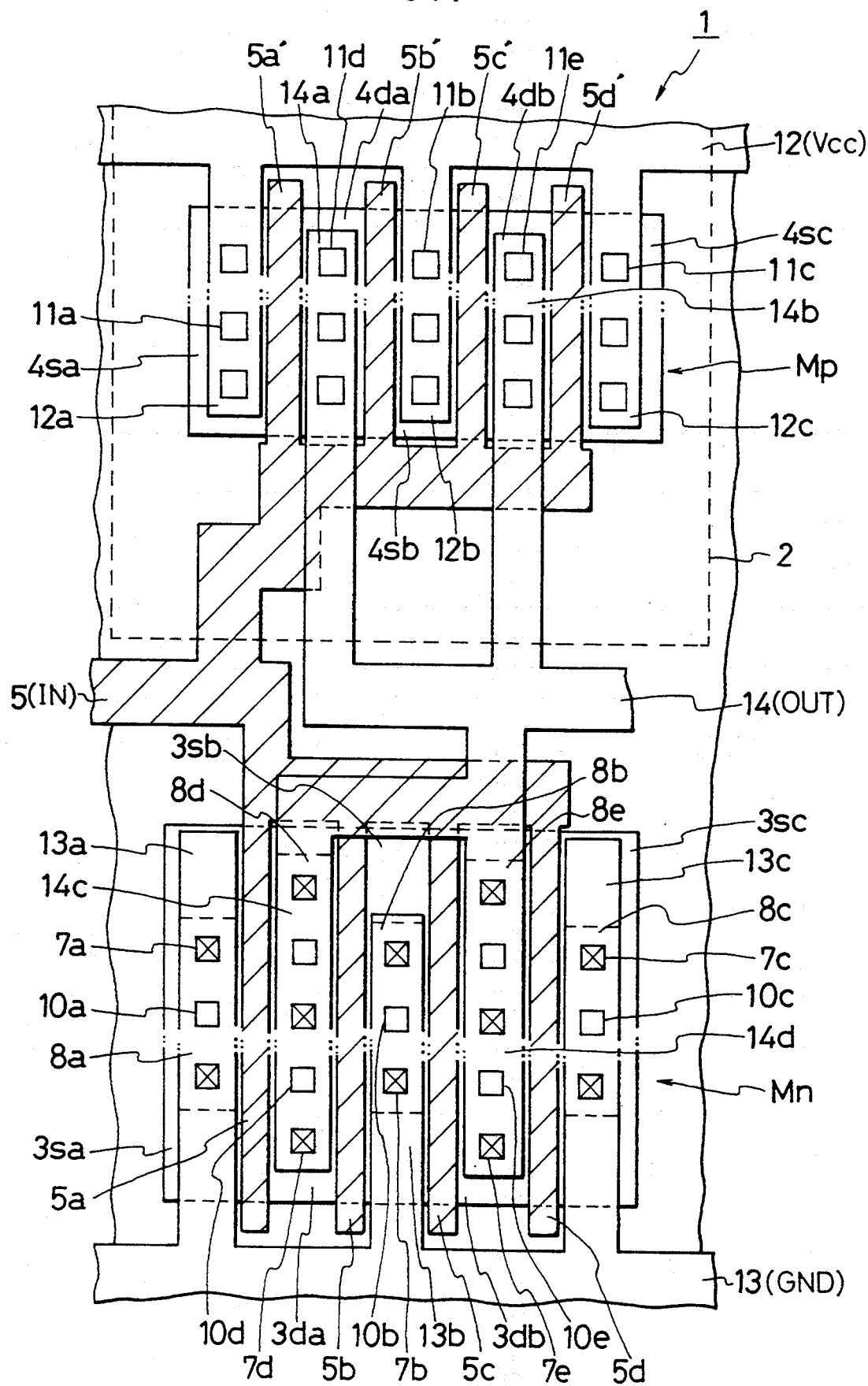
FIG. 1 shows a layout of a CMOS inverter in an internal circuit of a semiconductor integrated circuit device according to an embodiment of the present invention.

A CMOS inverter in a semiconductor integrated circuit device is shown in FIG. 1, which is composed of a p-channel MOS transistor Mp and an n-channel MOS transistor Mn connected in series.

The n-channel MOS transistor Mn comprises source regions 3sa, 3sb and 3sc and drain regions 3da and 3db formed in a surface area of a Si substrate 1, and gate electrodes 5a, 5b, 5c and 5d formed through a gate insulator (not shown) on the surface of the substrate 1, which are placed at regular intervals.

The drain region 3da is disposed between the source regions 3sa and 3sb, and the drain region 3db is disposed between the source regions 3sb and 3sc. The gate electrode 5a is disposed between the source region 3sa and the drain region 3da, the gate electrode 5b is disposed between the drain region 3da and the source region 3sb, the gate electrode 5c is disposed between the source region 3sb and the drain region 3db, and the gate electrode 5d is disposed between the drain region 3db and the source region 3sc. Thus, the transistor Mn has divided channels.

The lengths of the gate electrodes 5a, 5b, 5c and 5d are 1.0 $\mu m$, and effective channel widths are 56 $\mu m$, respectively. The total effective channel width is $56 \times 4 = 224$ $\mu m$. The gate insulator has a thickness of about 18 nm. In FIG. 1, the central part of the transistor Mn is omitted for the sake of simplification of the illustration.

The p-channel MOS transistor Mp is placed in a p-well 2 formed in the substrate 1, and it comprises source regions 4sa, 4sb and 4sc and drain regions 4da and 4db formed in the surface area of the substrate 1, and gate electrodes 5a', 5b', 5c' and 5d' formed through a gate insulator (not shown) on the surface of the substrate 1, which are placed at regular intervals.

The drain region 4da is disposed between the source regions 4sa and 4sb, and the drain region 4db is disposed between the source regions 4sb and 4sc. The gate electrode 5a' is disposed between the source region 4sa and the drain region 4da, the gate electrode 5b' is disposed between the drain region 4da and the source region 4sb, the gate electrode 5c' is disposed between the source region 4sb and the drain region 4db, and the gate electrode 5d' is disposed between the drain region 4db and the source region 4sc. Thus, the transistor Mp also has divided channels.

The lengths of the gate electrodes 5a', 5b', 5c' and 5d' are 1.2 μm, and effective channel widths are 28.5 μm, respectively. The total effective channel width is 28.5×4=114 μm. In FIG. 1, the central part of the transistor Mp is also omitted for the sake of simplification.

The exposed surface of the substrate 1 and the surfaces of the gate electrodes 5a, 5b, 5c, 5d, 5a', 5b', 5c' and 5d' are covered with a first interlayer insulator film 6 with a thickness of about 550 nm. The insulator film 6 is made of $SiO_2$ or the like.

On the first interlayer insulator film 6, a second interlayer insulator film 9 made of $SiO_2$ or the like is formed, and on the second interlayer insulator film 9, a power supply wiring layer 12, a ground wiring layer 13 and output wiring layer 14 are formed, as shown in FIG. 1, which are made of Al base metal, respectively. A covering film 15 covers the entirety of the wiring layers 12, 13 and 14 and the exposed surface of the second interlayer insulator film 9.

The power supply wiring layer 12 has three branches 12a, 12b and 12c which respectively extend over the source regions 4sa, 4sb and 4sc of the p-channel MOS transistor Mp. The ground wiring layer 13 has three branches 13a, 13b and 13c which respectively extending over the source regions 3sa, 3sb and 3sc of the n-channel MOS transistor Mn. The output wiring layer 14 has branches 14a and 14b respectively extending over the drain regions 4da and 4db of the p-channel MOS transistor Mp, and the branches 14c and 14d respectively extending over the drain regions 3da and 3db of the n-channel MOS transistor Mn.

An input wiring layer 5 is electrically connected to the gate electrodes 5a, 5b, 5c, 5d, 5a', 5b', 5c' and 5d', each of which is made of polysilicon or the like and formed between the first and second interlayer insulator films 6 and 9.

Figure 2A:
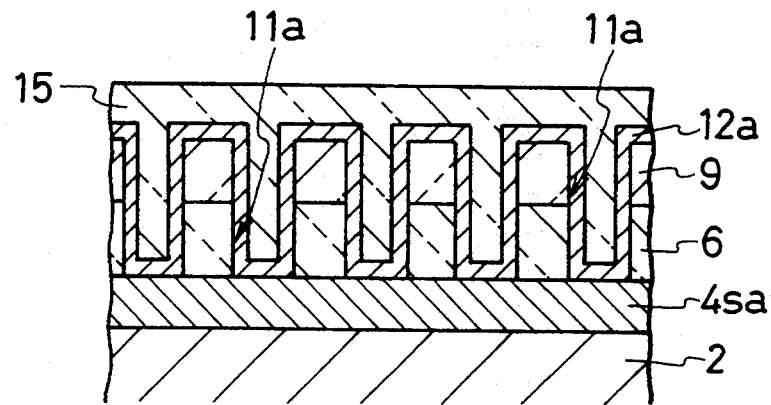
FIG. 2A shows a contact structure of the p-channel MOS transistor of the CMOS inverter shown in FIG. 1.
Figure 2B:
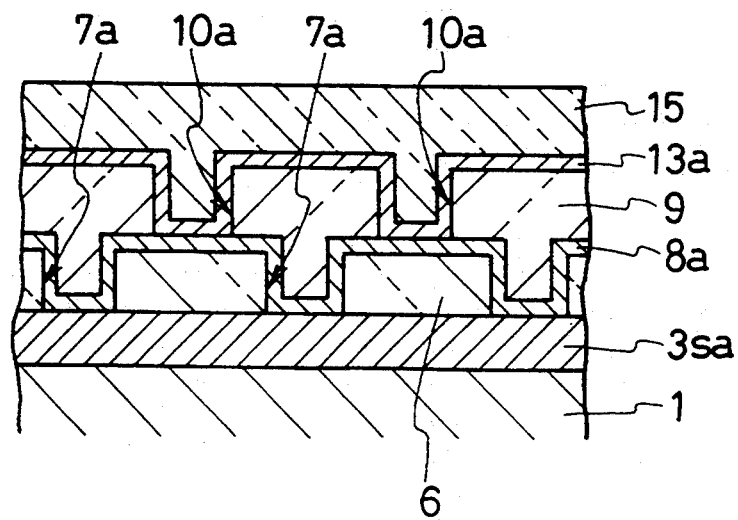
FIG. 2B shows a contact structure of the n-channel MOS transistor of the CMOS inverter shown in FIG. 1.
Figure 3:
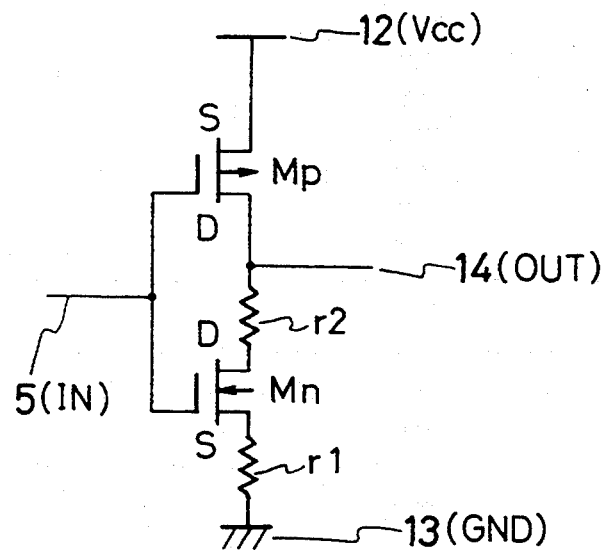
FIG. 3 shows an equivalent circuit diagram of the CMOS inverter shown in FIG. 1.

As shown in FIGS. 1 and 2B, between the first and second interlayer insulator films 6 and 9, five contact layers 8a, 8b, 8c, 8d and 8e made of tungsten silicide $WSi_x$ (x=2.5−2.7) which are higher in electrical resistance than Aluminum and its alloys are provided, each of which has a thickness of about 200 nm. The contact layers 8a, 8b, 8c, 8d and 8e are placed just above the source regions 3sa, 3sb and 3sc and the drain regions 3da and 3db of the n-channel MOS transistor Mn, respectively.

The contact layers 8a, 8b, 8c, 8d and 8e are stripe-shaped extending along the source regions 3sa, 3sb and 3sc and the drain regions 3da and 3db, respectively. The lengths of the contact layers 8a, 8b, 8c, 8d and 8e are determined according to the size, number and arrangement of contact holes described later.

As shown in FIG. 2B, the source region 3sa is in contact with the contact layer 8a through first contact holes 7a. The holes 7a are arranged in the first interlayer insulator film 6 along the longitudinal axis of the source region 3sa at intervals or pitches of 4.1 μm. The contact layer 8a is in contact with the branch 13a of the ground wiring layer 13 through second contact holes 10a. The holes 10a are arranged in the second interlayer insulator film 9 along the longitudinal axis of the source region 3sa at the same intervals or pitches as those of the first contact holes 7a. The first contact holes 7a are shaped like a rectangle of 0.8 μm×0.8 μm, and the second contact holes 10a are shaped like a rectangle of 0.8 μm×0.7 μm.

The first and second contact holes 7a and 10a are alternately arranged in the longitudinal directions of the source region 3sa, that is, the respective second contact holes 10a are disposed between the adjacent two first contact holes 7a, and the respective first contact holes 7a are disposed between the adjacent two second contact holes 10a.

Similarly, the source regions 3sb and 3sc of the MOS transistor Mn are respectively in contact with the contact layers 8b and 8c through first contact holes 7b and 7c. The holes 7b and 7c are arranged in the first interlayer insulator film 6 along the longitudinal axes of the source regions 3sb and 3sc at intervals or pitches of 4.1 μm, respectively. The contact layers 8b and 8c are respectively in contact with the branches 13b and 13c of the ground wiring layer 13 through second contact holes 10b and 10c. The holes 10b and 10c are arranged in the second interlayer insulator film 9 along the longitudinal axes of the source regions 3sb and 3sc at the same intervals or pitches as those of the first contact holes 7b and 7c, respectively.

The first contact holes 7b and 7c are shaped like a rectangle of 0.8 μm×0.8 μm, and the second contact holes 10b and 10c are shaped like a rectangle of 0.8 μm×0.7 μm, respectively.

Similarly to the first and second contact holes 7a and 10a, the first contact holes 7b and 7c and the second contact holes 10b and 10c are also arranged alternately in the longitudinal directions of the source regions 3sb and 3sc, respectively.

The drain region 3da of the transistor Mn is in contact with the contact layer 8d through first contact holes 7d. The holes 7d are arranged in the first interlayer insulator film 6 along the longitudinal axis of the drain region 3da at intervals or pitches of 4.1 μm. The contact layer 8d is in contact with the branch 14a of the output wiring layer 14 through second contact holes 10d. The holes 10d are arranged in the second interlayer insulator film 9 along the longitudinal axis of the drain region 3da at the same intervals or pitches as those of the first contact holes 7d.

The shape, size and arrangement of the first and second contact holes 7d and 10d are the same as those of the first and second contact holes 7a and 10a, respectively.

Similarly, the drain region 3db of the MOS transistor Mn is in contact with the contact layer 8e through first contact holes 7e. The holes 7e are arranged in the first interlayer insulator film 6 along the longitudinal axis of the drain region 3db at intervals or pitches of 4.1 μm. The contact layer 8e is in contact with the branches 14d of the output wiring layer 14 through second contact holes 10e. The holes 10e are arranged in the second interlayer insulator film 9 along the longitudinal axis of the drain region 3db at the same intervals or pitches as those of the first contact holes 7e.

The shape, size and arrangement of the first and second contact holes 7e and 10e are the same as those of the first and second contact holes 7d and 10d, respectively.

The first contact holes 7a, 7b and 7c respectively placed on the source regions 3sa, 3sb and 3sc are arranged in straight lines perpendicular to the source regions 3sa, 3sb and 3sc, respectively. The second contact holes 10a, 10b and 10c respectively placed over the source regions 3sa, 3sb and 3sc are arranged in the other straight lines perpendicular to the source regions 3sa, 3sb and 3sc, respectively.

The first contact holes 7d and 7e respectively placed on the drain regions 3da and 3db are arranged in straight lines perpendicular to the drain regions 3da and 3db, respectively. The second contact holes 10d and 10e respectively placed over the drain regions 3da and 3db are arranged in the other straight lines perpendicular to the drain regions 3da and 3db, respectively.

The first contact holes 7a and 7b are staggered with respect to the gate electrode 5a, and second contact holes 10a and 10b are also staggered with respect to the gate electrode 5a. In other words, at the respective corresponding positions on the each side of the gate electrode 5a, pairs of the first contact hole 7a and the second contact hole 10d and pairs of the first contact hole 7d and the second contact hole 10a are successively disposed along the gate electrode 5a. The distance between the center line of the gate electrode 5a and the respective centers of the first and second contact holes 7a, 7d, 10a and 10d is 2.0 μm. With the contact holes and the gate electrodes other than the contact holes 7a and 7b and the gate electrode 5a, the same positional relations are established.

The p-channel MOS transistor Mp does not have layers such as the contact layers 8a, 8b, 8c, 8d and 8e. As shown in FIG. 2A, the source region 4sa is in contact with the branch 12a of the power supply wiring layer 12 through third contact holes 11a. The holes 11a are formed in the first and second interlayer insulator films 6 and 9 and penetrate both films 6 and 9.

The third contact holes 11a are shaped like a rectangle of dimensions 0.9 μm × 1.0 μm, and are arranged along the longitudinal axis of the source region 4sa at intervals or pitches of 2.0 μmm.

Similarly, the source regions 4sb and 4sc are respectively in contact with the branches 12b and 12c of the power supply wiring layer 12 through third contact holes 11b and 11c. The holes 11b and 11c formed in the first and second interlayer insulator films 6 and 9 penetrate both films 6 and 9.

The shape, size and arrangement of the third contact holes 11b and 11c are the same as those of the third contact holes 11a.

The drain regions 4da and 4db of the MOS transistor Mp are respectively in contact with the branches 14a and 14b of the output wiring layer 14 through third contact holes 11d and 11e. The holes 11d and 11e are formed in the first and second interlayer insulator films 6 and 9 and penetrate both films 6 and 9.

The shape, size and arrangement of the third contact holes 11d and 11e are the same as those of the third contact holes 11a.

Since the CMOS inverter has the above-described configuration, the electric resistance value between the source regions 3sa, 3sb and 3sc of the n-channel MOS transistor Mn and the branches 13a, 13b and 13c of the ground wiring layer 13 increases by the total electric resistance value in the contact layers 8a, 8b and 8c. Similarly, the electric resistance value between the drain regions 3da and 3db of the n-channel MOS transistor Mn and the branches 14a and 14b of the output wiring layer 14 increases by the total electric resistance value in the contact layers 8d and 8e. On the contrary, with the p-channel MOS transistor Mp, such increases in electric resistance do not take place. Therefore, the equivalent circuit configuration of the inverter can be shown as in FIG. 3.

As described above, the semiconductor integrated circuit device of the embodiment includes the CMOS inverter, in which both of the n- and p-channel MOS transistors Mn and Mp have a total effective channel width of more than 100 μm, a resistor r1 (electric resistance 30 Ω) is provided between the source regions 3sa, 3sb and 3sc and the ground wiring layer 13, and a resistor r2 (electric resistance is 30 Ω) is provided between the drain regions 3da and 3db and the output wiring layer 14. As a result, even if electrostatic pulses are applied through the power supply and ground terminals of the device, the CMOS inverter can be prevented from being destroyed.

Besides, the contact layers 8a, 8b and 8c as small equivalent resistances are connected in parallel to the source of the n-channel MOS transistor Mn, and the contact layers 8d and 8e as equivalent resistances are connected to the drain thereof, so that any influence on the inverter operation due to the contact layers 8a, 8b, 8c, 8d and 8e can be neglected.

Further, since the contact layers 8a, 8b, 8c, 8d and 8e are provided between the first and second interlayer insulator films 6 and 9, the chip-occupied area of the inverter does not increase, and as a result, there are no problems regarding pellet-size.

For example, with a Dynamic Random Access Memory (DRAM), an intermediate wiring layer is provided between two interlayer insulator films stacked for forming its bit lines. The contact layers 8a, 8b, 8c, 8d and 8e can be made by utilizing the intermediate wiring layer easily, and therefore, there is an advantage that a special or particular layer is not required for the contact layers 8a, 8b, 8c, 8d and 8e, and that the contact layers 8a, 8b, 8c, 8d and 8e can be made in the same fabrication process as that of forming the bit lines.

The withstanding voltage for electrostatic discharge of the integrated circuit device was measured under the conditions that electric charges stored in a 100 pF capacitor were applied through a 1.5 kΩ resistor between the power supply terminal and the ground terminal of the device. Then, the maximum withstanding voltage was 2000 volt.

Modifications of the invention herein disclosed will occur to a person skilled in the art and all such modifications are deemed to be within the scope of this invention as defined by the appended claims.

What is claimed is:

1. A semiconductor integrated circuit device comprising:
   a semiconductor substrate;
   an MOS transistor composed of a source region and a drain region formed in said substrate and a gate electrode formed through a gate insulator on a surface of said substrate;
   a first wiring layer electrically connected to said gate electrode, a signal being supplied to said MOS transistor through said first wiring layer;
   a first interlayer insulator film having first contact holes arranged at intervals, said first interlayer insulator film being formed on said substrate and covering said source region and said drain region and said gate electrode;
   a first contact layer and a second contact layer formed on said first interlayer insulator film, said first contact layer being selectively placed over only said source region and said second contact layer being selectively placed over only said drain region;

a second interlayer insulator film having second contact holes arranged between adjacent first contact holes, said second interlayer insulator film being formed on said first interlayer insulator film and covering said first contact layer and said second contact layer while keeping said first and second contact layers exposed through said second contact holes; and a second wiring layer and a third wiring layer formed on said second interlayer insulator film, said second wiring layer and said third wiring layer being electrically connected to said source region and said drain region, respectively;

wherein said first contact layer and said second contact layer are made of material higher in electric resistance than said second wiring layer and said third wiring layer;

said source region and said drain region are electrically connected through said first contact holes to said first contact layer and said second contact layer, respectively; and said first contact layer and said second contact layer are electrically connected through said second contact holes to said second wiring layer and said third wiring layer, respectively.

2. The semiconductor integrated circuit device as claimed in claim 1, wherein a plurality of said source regions and a plurality of said drain regions are provided in said substrate, and a channel of said MOS transistor is divided between said plurality of source and drain regions.

3. The semiconductor integrated circuit device as claimed in claim 1, wherein said source regions and drain regions are elongated and said first contact holes and said second contact holes are alternately arranged in longitudinal directions of said source region and said drain region, respectively.

4. The semiconductor integrated circuit device as claimed in claim 3, wherein an effective channel width of said MOS transistor is 100 μm or more.

5. The semiconductor integrated circuit device as claimed in claim 4, wherein both of said first contact layer and said second contact layer are made of metal silicide.

6. The semiconductor integrated circuit device as claimed in claim 1, wherein both of said first contact layer and said second contact layer are made of the same material as that of an intermediate wiring layer formed between said first interlayer insulating film and said second interlayer insulating film.

7. The semiconductor integrated circuit device as claimed in claim 6, wherein both of said first contact layer and said second contact layer are made of metal silicide.

8. The semiconductor integrated circuit device as claimed in claim 1, wherein said MOS transistor belongs to an internal circuit of said device, in which said MOS transistor is not directly connected to external terminals or pins of said device.

9. A semiconductor integrated circuit device comprising:

a semiconductor substrate;

an n-channel MOS transistor composed of a source region and a drain region formed in said substrate and a gate electrode formed through a gate insulator on a surface of said substrate;

a p-channel MOS transistor composed of a source region and a drain region formed in said substrate and a gate electrode formed through a gate insulator on said surface of said substrate, said p-channel MOS transistor constituting a CMOS inverter together with said n-channel MOS transistor;

a first wiring layer electrically connected to said gate electrodes of said n-channel MOS transistor and said p-channel MOS transistor, a signal being supplied to said MOS transistor through said first wiring layer;

a first interlayer insulator film having first contact holes arranged at intervals, said first interlayer insulator film being formed on said substrate and covering said source regions and said drain regions and said gate electrodes of said n-channel MOS transistor and said p-channel MOS transistor;

a first contact layer and a second contact layer formed on said first interlayer insulator film, said first contact layer being selectively placed only over said source region, and said second contact layer being selectively placed only over said drain region of said n-channel MOS transistor;

a second interlayer insulator film having second contact holes arranged between adjacent first contact holes, said second interlayer insulator film being formed on said first interlayer insulator film and covering said first contact layer and said second contact layer while keeping said first and second contact layers exposed through said second contact holes;

a second wiring layer formed on said second interlayer insulator film, said second wiring layer being electrically connected to said source region of said p-channel MOS transistor;

a third wiring layer formed on said second interlayer insulator film, said third wiring layer being electrically connected to said source region of said n-channel MOS transistor; and a fourth wiring layer formed on said second interlayer insulator film, said fourth wiring layer being electrically connected to said drain regions of said n-channel MOS transistor and said p-channel MOS transistor;

wherein said first contact layer and said second contact layer are made of material higher in electric resistance than said second wiring layer, third wiring layer and fourth wiring layer;

said source region and said drain region of said n-channel MOS transistor are electrically connected through said first contact holes to said first contact layer and said second contact layer, respectively;

said first contact layer and said second contact layer are electrically connected through said second contact holes to said second wiring layer and said third wiring layer, respectively;

said first interlayer insulator film and said second interlayer insulator film have third contact holes, said third contact holes passing through said first interlayer insulator film and said second interlayer insulator film; and said source region and said drain region of said p-channel MOS transistor are electrically connected through said third contact holes to said second wiring layer and said fourth wiring layer, respectively.

10. The semiconductor integrated circuit device as claimed in claim 9, wherein said n-channel MOS transistor and said p-channel MOS transistor each has a plurality of said source regions and a plurality of said drain regions in said substrate, and respective channels of said n-channel MOS transistor and said p-channel MOS transistor are divided between said plural source and drain regions.

11. The semiconductor integrated circuit device as claimed in claim 9, wherein said source regions and drain regions are elongated and said first contact holes and said second contact holes are alternately arranged in longitudinal directions of said source regions and said drain regions, respectively.

12. The semiconductor integrated circuit device as claimed in claim 11, wherein respective effective channel widths of said n-channel MOS transistor and said p-channel MOS transistor are 100 $\mu$m or more.

13. The semiconductor integrated circuit device as claimed in claim 12, wherein both of said first contact layer and said second contact layer are made of metal silicide.

14. The semiconductor integrated circuit device as claimed in claim 9, wherein both of said first contact layer and said second contact layer are made of the same material as that of an intermediate wiring layer formed between said first interlayer insulating film and said second interlayer insulating film.

15. The semiconductor integrated circuit device as claimed in claim 14, wherein both of said first contact layer and said second contact layer are made of metal silicide.

16. The semiconductor integrated circuit device as claimed in claim 19, wherein said n-channel MOS transistor and p-channel MOS transistor belong to an internal circuit of said device, in which both of said MOS transistors are not directly connected to external terminals or pins of said device.

* * * * *